United States Patent [19]

Ecklund

[11] Patent Number: 4,602,379
[45] Date of Patent: Jul. 22, 1986

[54] DUAL INDICATOR CIRCUIT FOR TUNING AND STEREO SIGNALS

[75] Inventor: Lawrence M. Ecklund, Wheaton, Ill.

[73] Assignee: Motorola, Inc., Schaumburg, Ill.

[21] Appl. No.: 605,711

[22] Filed: Apr. 30, 1984

[51] Int. Cl.$^4$ .............................................. H04H 5/00
[52] U.S. Cl. ..................................................... 381/12
[58] Field of Search ................... 381/12; 455/154, 159

[56] References Cited

U.S. PATENT DOCUMENTS 4,236,041  11/1980  Thomas ................................ 381/12

FOREIGN PATENT DOCUMENTS 960691   7/1960  United Kingdom .
1031345  1/1963  United Kingdom .
1076261  11/1964  United Kingdom .
1357860  9/1972  United Kingdom .

Primary Examiner—Forester W. Isen
Attorney, Agent, or Firm—Margaret Marsh Parker; James W. Gillman

[57] ABSTRACT

In a stereophonic broadcasting receiver, a single indicator with two levels of illumination serves to provide indication of both accurate tuning and the presence of stereophonic signals. One signal or a combination of signals related to the tuning circuits of the receiver cause the indicator to be illuminated to a perceptible level. When, by use of a pilot tone detector, it is certain that stereophonic signals are being received, additional current is caused to flow through the indicator, raising the illumination to the maximum allowable level. The circuit has particular application to manually tuned receivers.

7 Claims, 3 Drawing Figures

DUAL INDICATOR CIRCUIT FOR TUNING AND STEREO SIGNALS

BACKGROUND OF THE INVENTION

This invention relates to tuning indicators for radio receivers and, more particularly, to the provision of a single indicator and simplified circuitry to indicate both station tuning and stereo signal conditions.

Tuning indicators have a long history in the field of broadcast receivers, both AM and FM. Various kinds of devices have been utilized; in some receivers meters have been used; "tuning eye" or electron ray tubes were popular for a time, but generally an incandescent lamp bulb was coupled to a circuit which would only be activated when a station was properly tuned in. At the present time, many receiver designs employ light-emitting diodes (LED's) as indicators.

In FM stereophonic broadcasting, the stereo presence signal or pilot tone is a 19 kHz signal which is modulated onto the carrier only when the station is transmitting in stereo. In a receiver, a local oscillator at 78 kHz is divided down to provide the 38 kHz suppressed carrier of the stereo (L−R) signals. An LED may be used to indicate the presence of stereo signals and, typically, the LED circuit is coupled to the phase locked loop which is locked to the 19 kHz pilot tone.

In AM stereophonic broadcasting, on the other hand, the pilot tone is a subaudible or nearly subaudible tone which is added to the (L−R) signal before the latter is modulated onto the carrier, by whatever modulation scheme is desired. This low frequency tone is detected along with the L−R signal, then separately detected for use in activating the stereo indicator and, typically, a mono/stereo mode switch. Such a mode switch is desirable since operation of the stereo (L−R) circuits during monophonic reception can denigrate the performance of the receiver.

Presently, some AM stereo receivers utilize one indicator lamp or LED for indicating "locked-in" tuning, and a second lamp or LED to indicate that the station is broadcasting in stereo. In the interest of simplicity of design and lower cost, particularly in the case of lower priced manually tuned receivers, it would be desirable to provide, with one simple indicator, an indication that the receiver is properly tuned to a station and also whether that station is broadcasting in stereo.

SUMMARY OF THE INVENTION

It is, therefore, an object of the present invention to provide, with one indicator light, a dual indication of tuning and stereophonic reception.

It is a particular object to do this without the addition of complex or expensive components. This object, and others which will become apparent, is obtained in a circuit according to the invention by coupling an indicator to a point in a receiver circuit which changes voltage level when the receiver locks in on a station or is within a narrow margin of frequency error or is receiving a sufficient RF signal level, whereby sufficient current will flow through the indicator circuit to illuminate the indicator to an intermediate, but perceivable, level. The indicator circuit is also coupled to a second point in the receiver which will allow additional current to flow in the indicator when a stereo presence tone or "pilot" tone has been detected. Thus, when stereo signals are being received, the lamp or LED will be noticeably brighter than with monophonic signals.

DETAILED DESCRIPTION OF A PREFERRED EMBODIMENT

Figure 1:
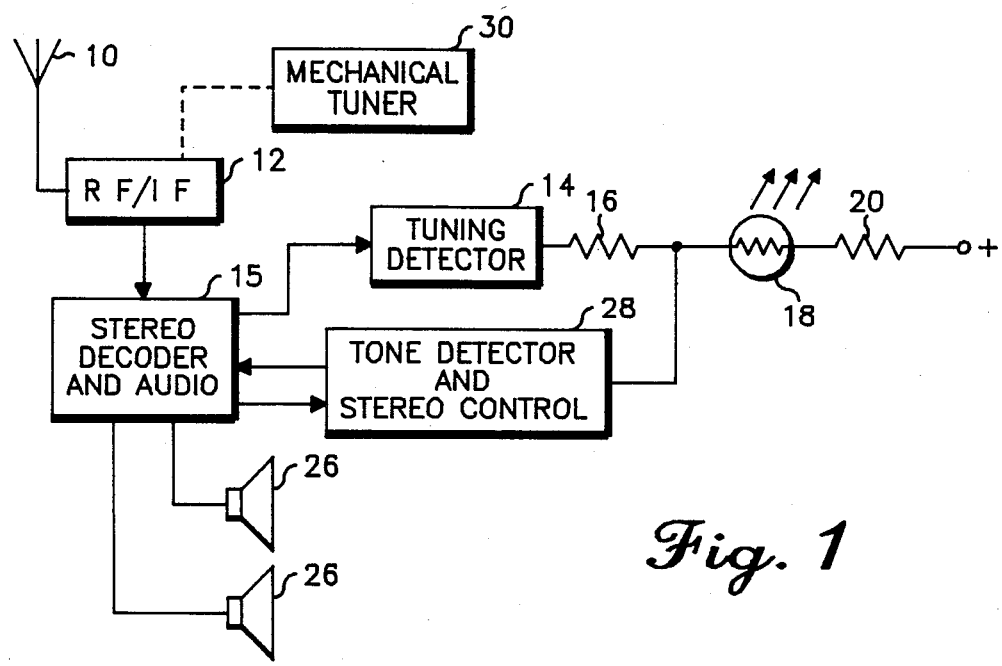
FIG. 1 is a block diagram of a receiver embodying the invention.

FIG. 1 is a highly simplified block diagram of a receiver for use in receiving amplitude modulated stereophonic signals. The receiver could be any one of many such receivers presently known, and the received AM stereo signals could have been modulated in any one of the modulation formats presently known as long as they include a subaudible stereo presence tone when stereophonic signals are being broadcast.

Thus, the signals will be received at an antenna 10 and processed in an RF/IF stage 12. A tuning detector 14 is coupled to some portion of a decoder and audio circuit 15 which will have a signal present only when the receiver is locked in on a station or is within a given tuning "window". The tuning detector 14 could, in some circumstances, be coupled to a corresponding output of the RF/IF stage 12. The output of the tuning detector will be coupled, through a resistor 16 or other current limiting device, to an LED 18 which is connected through a resistor 20 to a source of power 22.

The particular circuit of the decoder portion of the circuit 15 will depend on the modulation format of the received signals. There are at least five different AM stereophonic broadcasting systems and each of them utilizes a low frequency or subaudible signal modulated onto the stereo (L−R) channel for use in indicating the presence of stereo signals. The stereo and audio circuits 15 are coupled to a pair of speakers 26 and also to a stereo detector and control circuit 28. Again the specific circuitry of the circuits 28 will depend on the particular signals received. An output of the detector control circuit 28 is coupled back to the decoder and audio circuits 24 for activating the stereo portion of the output when a pilot tone is present. The output of the detector control circuit 28 is also coupled to the LED 18.

In operation, there will be an output signal from the tuning detector 14 only when an AM station has been tuned in accurately by means of a tuning knob, pushbutton, or similar tuning means 30. The detector 14 output terminal would, in the "tuned" condition, have the capability of sinking an amount of current sufficient to illuminate the LED. This current would be in the order of 50 mA. However, in the present invention, the resistor 16 will reduce this current to a point where the lamp will still be illuminated, but perceptibly less brightly.

Alternately, the current sink in the detector 14 and the resistor 16 could be replaced by a current source with a reduced level; i.e., about 4 ma. When the received signals are in stereo, and include a stereo presence or pilot tone which can be detected in the detector and control circuit 28, the LED will be fed an additional amount of current sufficient for complete illumination.

Figure 2:
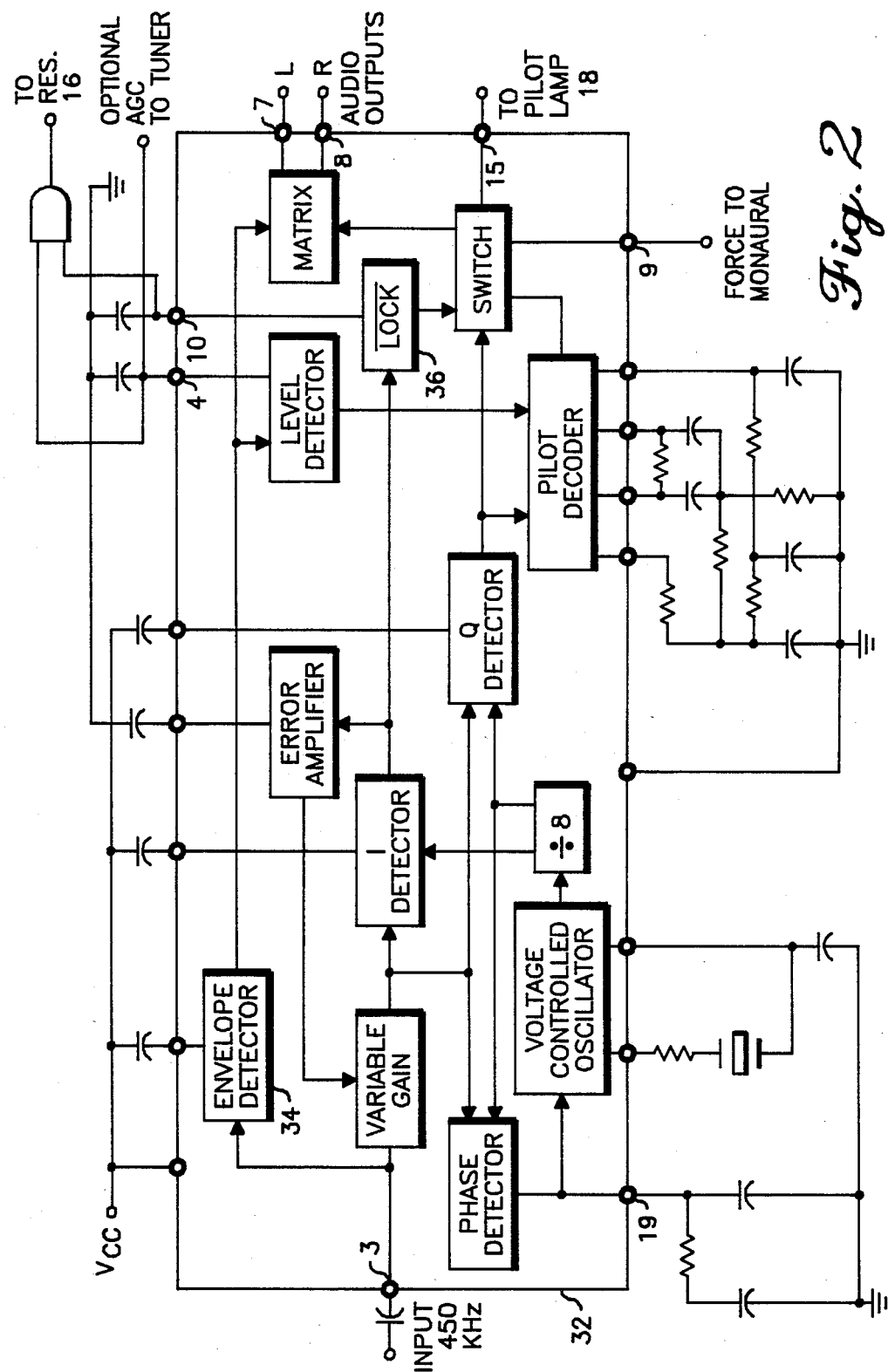
FIG. 2 is a block diagram of a typical stereo encoder IC as used in the invention.

In FIG. 2, the present invention is shown in one specific embodiment, using an IC 32, which is the MC13020, manufactured by Motorola, Inc. for use with the Motorola C-QUAMR system of AM stereo.

The IC 32 is a complete one-chip full-feature AM stereo decoding and pilot detection system. It employs full-wave envelope signal detection at all times for the (L+R) signal, and decodes (L−R) signals only in the presence of valid stereo transmission. The pin connections are shown so that the user of the invention can refer more easily to the complete information on the manufacturer's product data sheets.

The IC connections of FIG. 2 relate to the diagram of FIG. 1 as follows: the 450 kHz signal from the RF/IF stage is coupled into pin 3, the audio outputs L and R are on pins 7 and 8, respectively, pin 5 couples the LED 18 to the stereo tone detector and control circuit, and the outputs at pins 4 and 10 are ANDed to provide the signal which is coupled to resistor 16. The signal from pin 4 is preferably digitized before ANDing. Pin 9 is connected to provide a "force to monaural" function from an external control when such is desired.

In this embodiment, pin 4 provides a signal related to the detected signal level which is derived from the output of an envelope detector 34. The signal on pin 4 may be an AGC signal or may be a signal used in providing an AGC signal. The output from pin 10 comes from a lock detector 36 and signifies whether or not a station has been locked in. The signal from pin 10 is a digital signal and will be high when a station is tuned in, but should be low when tuning is not exact. However, at low incoming signal levels this signal may not be accurate, giving an indication that a station is tuned in when such is not the case. Thus, the signal from pin 4, preferably digitized, is ANDed with the first signal in AND gate 38 to provide a positive indication of exact tuning. In other words, the "lock" signal will be accurate when a station is tuned in, but may be inaccurate otherwise. After the signal on pin 4 goes high, the lock signal or window signal becomes the operative signal.

As in FIG. 1, when the ANDed signal is applied to the resistor 16, the LED 18 will be dimly illuminated. When the signal from pin 15 is applied to the LED 18, additional current will flow through the LED, and it will be fully illuminated.

Figure 3:
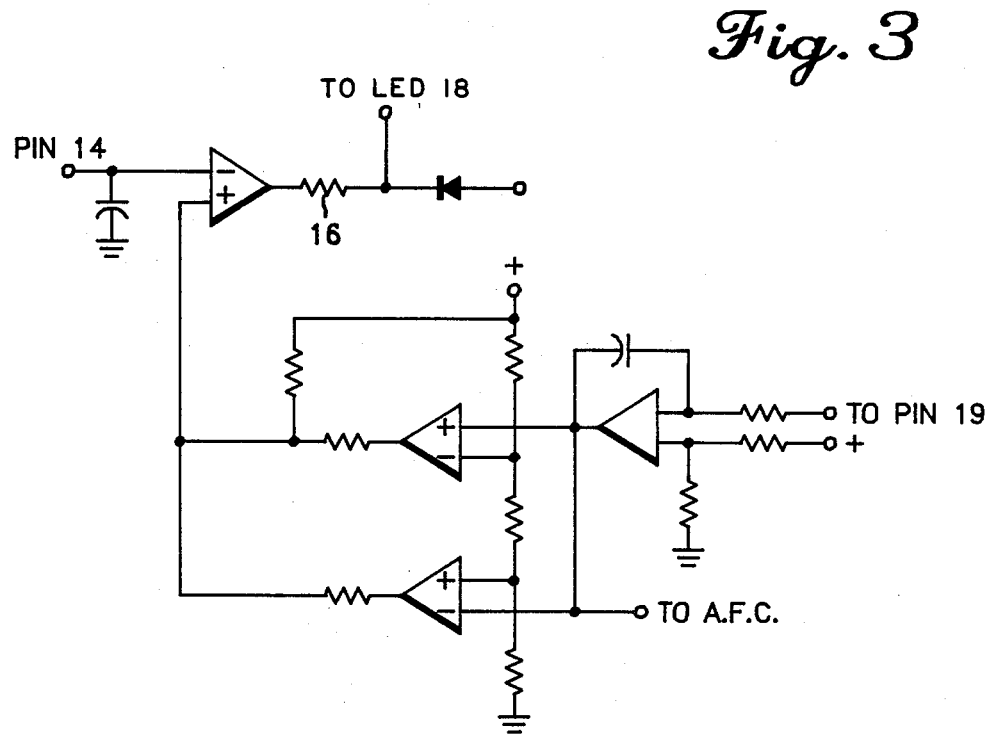
FIG. 3 is a circuit/logic diagram of another embodiment of the invention.

FIG. 3 shows an alternate embodiment and illustrates the use of a digitized "window" signal to provide a more accurate indication of tuning. An input signal from pin 19 of the IC 32, coming from the phase detector, is compared in a comparator C1 with a reference signal, the output of comparator C1 then representing the instantaneous error in the tuning. The error signal is coupled to two more comparators C2, C3, with different references or thresholds. The combined comparator output signal is then a "window" signal, having a high value outside of the window, and a low value within the window. This window signal is then coupled to a fourth comparator C4 which compares it with the signal from pin 4 of the IC 32. The window signal is thus now digitized, and the output is coupled to R16, as before.

Thus there has been shown an arrangement for providing a dual indication for both station tuning and stereo signal presence with a simplified circuit and one indicator. Other variations and modifications are possible, and it is intended to cover all such as fall within the spirit and scope of the appended claims.

What is claimed is:

1. A dual indicator for use in a stereophonic receiver and comprising:
   a visual indicator circuit including a light-emitting diode wherein the brightness of the diode is a function of the applied current;
   a source of current coupled to a first terminal of the diode;
   current limiting means coupled to a second terminal of the diode;
   tuning detector means coupled to a first portion of the receiver for detecting tuning status and for allowing current flow through the current limiting means only when the tuning detector means detects that a station is properly tuned in; and
   stereo presence tone detector means coupled to a second portion of the receiver for detecting the presence of stereophonic signals in the received signals by detection of a stereo presence tone, and coupled to the second terminal of said diode for allowing additional current flow through the diode when stereophonic signals are present.

2. A dual indicator circuit for use in a stereophonic receiver in accordance with claim 1 and further including level detector means coupled to be ANDed with the output of the tuning detector means.

3. A dual indicator circuit for use in a stereophonic receiver in accordance with claim 1 and wherein the tuning detector means includes means for detecting a locked condition in the receiver.

4. A dual indicator circuit for use in a stereophonic receiver in accordance with claim 1 and wherein the tuning detector means includes means for detecting that the receiver is tuned within a given frequency error of a station.

5. A dual indicator circuit for use in a stereophonic receiver in accordance with claim 1 and wherein the tuning detector means includes a first comparator means for providing a frequency error signal.

6. A dual indicator circuit for use in a stereophonic receiver in accordance with claim 5 and wherein the tuning detector means includes second and third comparator means, coupled to the first comparator means for providing an error window signal.

7. A dual indicator circuit for use in a stereophonic receiver in accordance with claim 6 and wherein the tuning detector means further includes means for ANDing the outputs of the second and third comparator means and means for digitizing the ANDed output signal.

* * * * *